United States Patent [19]

Hirukawa et al.

[11] Patent Number: 4,604,180
[45] Date of Patent: Aug. 5, 1986

[54] TARGET ASSEMBLY CAPABLE OF ATTAINING A HIGH STEP COVERAGE RATIO IN A MAGNETRON-TYPE SPUTTERING DEVICE

[75] Inventors: Yohichi Hirukawa; Toshiyuki Nozaki; Naokichi Hosokawa, all of Tokyo, Japan

[73] Assignee: Anelva Corporation, Tokyo, Japan

[21] Appl. No.: 692,837

[22] Filed: Jan. 18, 1985

[30] Foreign Application Priority Data

Jan. 20, 1984 [JP] Japan .................................. 59-8939

[51] Int. Cl.$^4$ .................................................. C23C 15/00
[52] U.S. Cl. ............................................................ 204/298
[58] Field of Search ........................................... 204/298

[56] References Cited

U.S. PATENT DOCUMENTS 4,265,729 5/1981 Morrison ............................ 204/298
4,428,816 1/1984 Class .................................. 204/298
4,472,259 9/1984 Class .................................. 204/298

Primary Examiner—T. M. Tufariello
Attorney, Agent, or Firm—Laff, Whitesel, Conte & Saret

[57] ABSTRACT

In a target assembly for use in a magnetron-type sputtering device, a target member of a predetermined material comprises first and second targets which has a planar and a sloping surface, respectively. The planar surface has a circular periphery and is parallel to at least one object held by a holder. The sloping surface has an inner periphery concentrically of the circular periphery and an outer periphery which is nearer to the holder than the inner periphery. The first and the second targets may mechanically be united together or separated from each other and are magnetically individually driven by the use of a magnet member, such as an electromagnet and a permanent magnet, to produce a first and a second partial magnetic field in the vicinity of the first and the second targets, respectively. An electric source member is connected to the first and the second targets to produce an electric field intersecting the first and the second partial magnetic fields. The electric source member may be common to the first and the second targets or divided into two portions for the first and the second targets. The first and the second targets may cooperate with a control circuit for controlling at least one of the first and the second partial magnetic fields and the electric field.

18 Claims, 10 Drawing Figures

TARGET ASSEMBLY CAPABLE OF ATTAINING A HIGH STEP COVERAGE RATIO IN A MAGNETRON-TYPE SPUTTERING DEVICE

BACKGROUND OF THE INVENTION

This invention relates to a target assembly for use in a magnetron-type sputtering device.

In a sputtering device of the type described, a target assembly is located in a hollow space. The target assembly is for use in sputtering a target material onto at least one object by the help of an electric field and a magnetic field which intersects the electric field. Such a target assembly comprises a target member of the target material and a magnet member for producing the magnetic field in the hollow space. The electric field is produced in the hollow space between the target member and the at least one object.

The sputtering device is often used in fabricating an integrated circuit in forming a thin film of, for example, metal on an object, such as a semiconductor piece or wafer. It is to be noted here that the object is microscopically never uniform on a surface thereof, even though it may macroscopically appear uniform. In other words, the surface may approximately be considered as a combination of a planar portion and step portions or projections which are offset from the planar portion and which are contiguous to the planar portion through corners or edges of the step portions. On depositing the thin film, it is preferable that the thin film is substantially uniform on both of the planar portion and the step portions. Otherwise, discontinuity of the films takes place at the step portions.

As will later be described in conjunction with a few figures of the accompanying drawing, the thin film is apt to become thin on the corners of the step portions. Moreover, the thin film is not uniform even on the corner of a sole one of the projections because the corner of the sole projection is not always covered with the thin film on the same sputtering conditions. For example, the corner has an inner part near to a center of the object and an outer part farther therefrom. When both surfaces of the object and target are set in parallel and both center axes are roughly aligned with each other, a sputtered deposit usually becomes thin at the outer part in comparison with the inner part, as being described later.

Let a thickness of the thin film be measured in a direction perpendicular to the thin film. In this event, it is possible to define a ratio of the thickness which are measured on the corner of the sole projection and the planar portion. The ratio may be called a step coverage ratio. It may be said that the thin film is more excellent as the step coverage ratio becomes near to unity. Preferably, the step coverage ratio defined at the outer part of the corner should be equal to that defined at the inner part thereof.

As will later be described with reference to several of about ten figures of the accompanying drawing, a conventional target assembly is defective in that the step coverage ratio becomes distant from unity as the projections are spaced away from the center of the object. Furthermore, the step coverage ratio is inevitably varied even at the inner and the opposite parts of the sole projection from each other. As a result, the conventional target assembly is incapable of forming a uniform film onto the nonuniform surface of the object.

SUMMARY OF THE INVENTION

It is therefore an object of this invention to provide a target assembly which is capable of rendering a step coverage ratio near to unity around each projection of an object subjected to sputtering.

It is another object of this invention to provide a target assembly of the type described, which is capable of forming a uniform film onto a nonuniform surface of the object.

Other object of this invention will become clear as the description proceeds.

A target assembly to which this invention is applicable is for use in a sputtering device and comprises holding means for holding at least one object in face to face relation to the target assembly and means for producing an electric field between the target assembly and the holding means. The target assembly comprises a target member of a predetermined material and a magnet member for producing a magnetic field which intersects the electric field. The sputtering device is for sputtering the predetermined material of the target member onto the at least one object with cooperation of the electric and the magnetic fields. According to this invention, the target member comprises a first and a second target having a planar and a sloping surface, respectively. The planar surface has a circular periphery with the at least one object held parallel by the holding means to the planar surface. The sloping surface has an inner periphery concentrically of the circular periphery and an outer periphery which is nearer to the holding means than the inner periphery. The magnet member comprises a first and a second magnet for producing a first part of the magnetic field adjacent to the planar surface and a second part of the magnetic field adjacent to the sloping surface, respectively.

DESCRIPTION OF THE PREFERRED EMBODIMENTS

Figure 1:
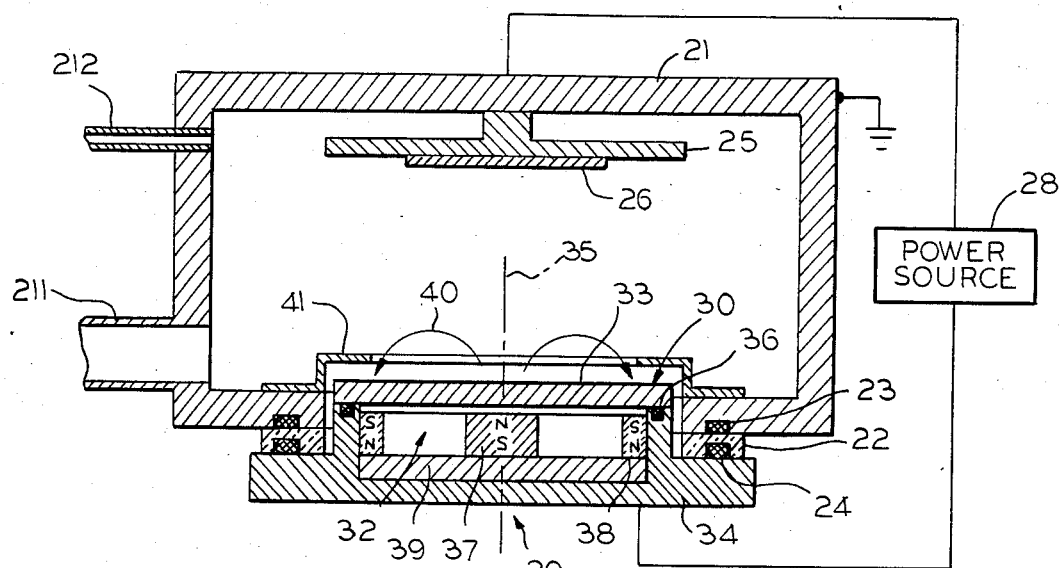
FIG. 1 is a schematic vertical sectional view of a magnetron-type sputtering device comprising a conventional target assembly.

Referring to FIG. 1, a conventional target assembly will be described at first for a better understanding of this invention. The target assembly 20 is for use in a magnetron-type sputtering device and is located so as to be exposed to a hollow space defined in a vessel 21 of the sputtering device. The hollow space can be evacuated through a pipe 211 by a vacuum pump (not shown). Also a gas, such as argon, can be introduced through a pipe 212 to provide an appropriate pressure for sustaining a glow discharge. The target assembly 20 is attached to an attachment opening of the vessel 21 by an attachment mechanism (not shown) through an electrical insulator 22. O-rings 23 and 24 are inserted between the vessel 21 and the insulator 22 and between the insulator 22 and the target assembly 20, respectively. The O-rings 23 and 24 are for hermetically sealing the target assembly 20 to the vessel 21.

The sputtering device comprises a holder 25 for holding an object 26 in face to face relation to the target assembly 20 with a predetermined space left between the holder 25 and the target assembly 20. The object 26 is, for example, a semiconductor piece or wafer. A d.c. power source 28 is for supplying a d.c. voltage between the target assembly 20 and the holder 25. The holder 25 is grounded through the vessel 21. The target assembly 20 is kept at a negative electric potential by the d.c. power source 28. The d.c. voltage produces an electric field between the target assembly 20 and the holder 25.

The target assembly 20 comprises a target member 30 and a magnet member 32. The target member 30 comprises a target 33 of a predetermined material, such as metal, and a conductive body 34 in contact with the target 33. The target 33 has an upper planar surface which has a circular periphery and which faces the object 26 and a lower planar surface which is the same shape as the upper planar surface and is opposite to the upper planar surface. The target 33 has a center axis 35 which passes through a center point of the target 33 perpendicularly of both of the upper and the lower planar surfaces. The conductive body 34 has a recessed portion and is locally brought into contact with the lower planar surface. A gap is formed by the recessed portion and the target 33. An O-ring 36 is laid between the target 33 and the conductive body 34 for hermetically sealing the gap.

The magnet member 32 is placed in the gap. The gap is for circulation of water for cooling the target 33, although an inlet and an outlet of the coolant are not shown. The magnet member 32 comprises a pair of permanent magnets 37 and 38. The permanent magnet 37 is of a cylindrical shape. The permanent magnet 38 is of a ring-shape and surrounds the permanent magnet 37. The permanent magnets 37 and 38 are positioned around the center axis 35. A yoke 39 is for magnetically connecting the permanent magnets 37 and 38.

The permanent magnet pair 37 and 38 produces a magnetic field specified by a few arc-shaped magnetic lines 40 of flux. The magnetic field is produced in the predetermined space adjacently of the upper planar surface between the center point and the circular periphery. As a result, the magnetic field intersects the electric field. The target member 30 is covered along the circular periphery of the upper planar surface with a shield 41 of a conductor with a slight gap left between the target member 30 and the shield 41. The shield 41 is attached to an inner surface of the vessel 21 and is therefore grounded through the vessel 21. The shield 41 has a wide central opening and prevents ions produced in the predetermined space from undesiredly bombarding the target member 30 except the upper planar surface of the target 33. The sputtering device is for sputtering the predetermined material of the target 33 onto the object 26 with cooperation of the electric and the magnetic fields in the predetermined space.

With this structure, a plasma of a high density is produced in a ring-shaped space to which the upper planar surface of the target 33 is exposed and in which the magnetic lines 40 are present. The ring-shaped space is positioned around the center axis 35. The target 33 is subjected to ion bombardment of a high density on a ring-shaped area of the upper planar surface which is exposed to the ring-shaped space. As a result, sputtered particles of the predetermined material are emitted from the ring-shaped area to the object 26 to form a thin film of the predetermined material on the object 26. A discharge operation and a sputtering operation in the magnetron-type sputtering device are known in the art and will not be described any longer.

Figure 2:
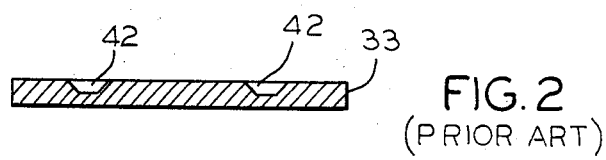
FIG. 2 is a vertical sectional view of a target depicted in FIG. 1 after the target is subjected to sputtering for a long time.

Referring to FIG. 2, an illustration is made of a target 33 which is subjected to sputtering for a long time. As shown in FIG. 2, a circular ring-shaped groove 42 is formed on the ring-shaped area of the target 33. This means that the ring-shaped area is drastically bombarded and etched by ions drastically.

Figure 3:
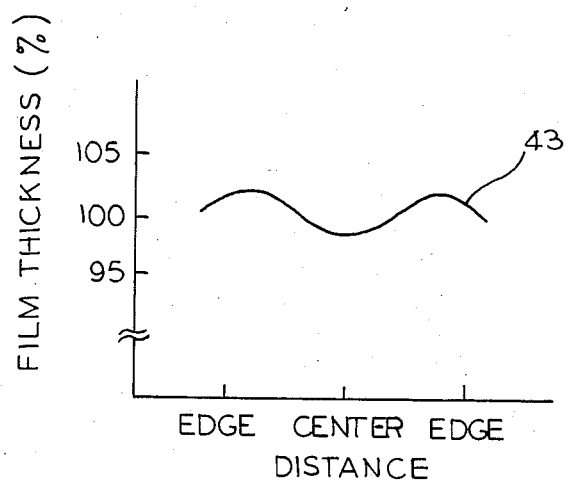
FIG. 3 shows a macroscopical thickness distribution of a thin film formed on an object illustrated in FIG. 1.

Referring to FIG. 3, a curve 43 shows a relationship between a macroscopical thickness distribution of a thin film formed on the object 26 and a distance measured in the direction of a diameter of the object 26. The distance is measured on condition that a center of the object 26 is in alignment with the center axis 35 of the target 33 in the sputtering device illustrated in FIG. 1. It is assumed that an average thickness is calculated as regards the thin film formed on the whole surface of the object 26 and is put at 100%. The curve 43 shows that a macroscopical uniformity of the thin film is kept within an extent between $-5$ and $+5\%$ if the distance between the object 26 and the target 33 is suitably selected.

Figure 4:
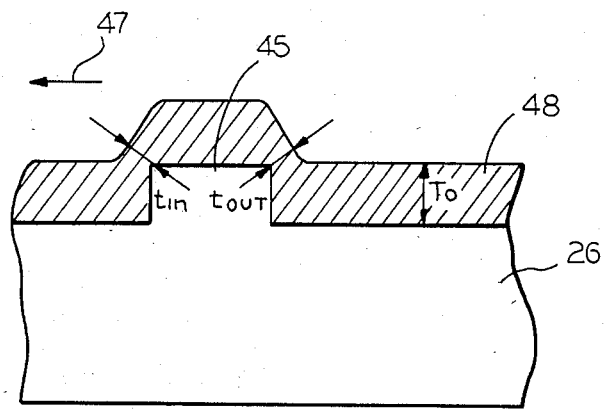
FIG. 4 is a schematic vertical sectional view of a part of the object illustrated in FIG. 1 for use in describing a step coverage ratio of a thin film formed on the object.

Referring to FIG. 4, a partial cross section of the object 26 is microscopically and diagrammatically illustrated. Although an actual surface topography is very complicated, the surface may approximately be composed of a combination of a planar portion and step portions or projections, one of which is shown at 45. Thus, the surface of the object 26 is microscopically nonuniform even though it appears uniform macroscopically. Each step portion 45 is offset from the planar portion and is contiguous to the planar portion through corners of each step portion 45. It will be assumed that the object 26 is a semiconductor wafer. The object 26 usually has a diameter between 100 and 200 millimeters. A height of each projection 45 reaches about 1 micron meter. Removal of such microscopical projections is impossible by the use of a current technique used in fabricating an integrated circuit. A direction of the center of the object 26 is suggested at an arrow 47. Therefore, the center of the object 26 is positioned on the left side of the projection 45 illustrated in FIG. 4. The illustrated projection has an inner and an outer part of the corner which are nearer to and farther from the center of the object 26, respectively, and which are placed on the left and the right sides of this figure, respectively. A thin film 48 formed on the object 26 has a thickness $T_0$ on the planar portion. The thin film 48 further has thicknesses $t_{in}$ and $t_{out}$ on the inner and the outer parts of the corner, respectively. Attention will now be directed to a step coverage ratio described hereinabove. The step coverage ratio of the thickness $t_{in}$ or $t_{out}$ to the thickness $T_0$ may be utilized in order to represent a degree of coverage of each corner of the projection 45 with the thin film 48. The step coverage ratios at the inner and the outer parts may be called inner and outer coverage ratios, respectively. Each of the inner and the outer coverage ratios $t_{in}/T_0$ and $t_{out}/T_0$ is less than unity. If the thin film 48 is of a metal and acts as a conductor on the semiconductor wafer 26, the conductor becomes locally thin or is reduced in thickness at the corner of the projection 45. This causes a liability of breakage in the conductor in the manner as known in the art. Such a local reduction of the conductor in thickness must therefore be avoided. Thus, it is desirable to make the step coverage ratio approach unity.

Figure 5:
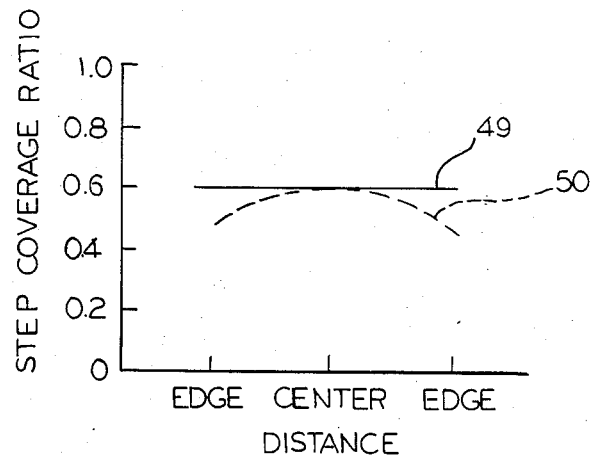
FIG. 5 shows step coverage distributions of a thin film formed on the object illustrated in FIG. 1.

Referring to FIG. 5, a solid-line curve 49 shows a distribution of the inner coverage ratio $t_{in}/T_0$ which is measured along the direction of a diameter of the object 26 on condition that the center of the object 26 is in alignment with the center axis 35 of the target 33 in the sputtering device illustrated in FIG. 1. Although the inner coverage ratio $t_{in}/T_0$ is less than unity at whichever position of the object 26, the distribution of the inner coverage ratio $t_{in}/T_0$ is approximately uniform. On the other hand, a dashed-line curve 50 shows a distribution of the outer coverage ratio $t_{out}/T_0$ measured along the direction of the diameter. The outer coverage ratio $t_{out}/T_0$ is almost the same as the inner coverage ratio $t_{in}/T_0$ at the center of the object 26 and is lowered as a distance becomes large from the center of the object 26. Of course the coverage distribution is influenced by the geometrical dimensions of the object diameter, the target diameter, and the distance between both. In other words, one can obtain more uniform step coverage distribution when one can use a larger diameter target. But, in the economical viewpoint, smaller dimension of the target is preferable.

As described above, the conventional target assembly is capable of macroscopically attaining a sufficient uniformity of the film thickness distribution. However, the film thickness is microscopically small around each projection of the object 26. The step coverage ratio is especially lowered on a peripheral part of the object 26. As a result, the target assembly is incapable of forming a uniform film onto the nonuniform surface of the object 26.

This invention provides a target assembly which is capable of making each of the inner and the outer coverage ratios high around each projection of the object 26 and rendering both coverage ratios substantially equal to each other. Accordingly, a uniform film can be formed on the nonuniform surface of the object 26.

Figure 6:
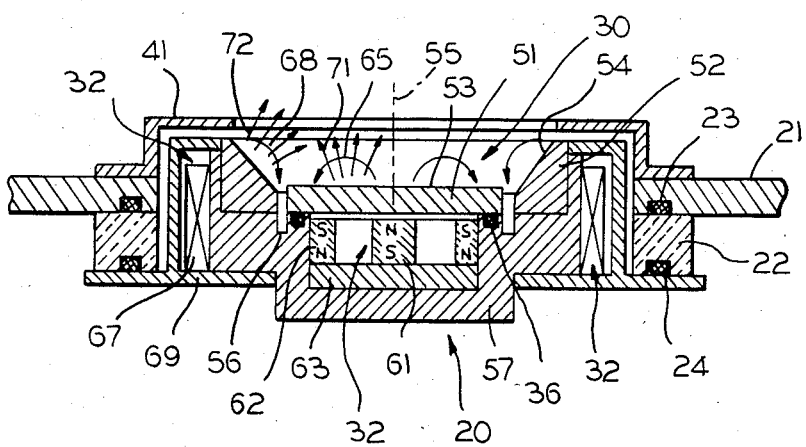
FIG. 6 is a schematic vertical sectional view of a target assembly according to a first embodiment of this invention.

Referring to FIG. 6, a target assembly according to a first embodiment of this invention comprises similar parts designated by like reference numerals.

The target member 30 comprises first and second targets 51 and 52 which have planar and sloping surfaces 53 and 54, respectively.

The planar surface 53 has a circular periphery. The object 26 (FIG. 1) is held parallel by the holder 25 (FIG. 1) to the planar surface 53. The first target 51 has a center axis 55 which is perpendicular to the planar surface 53 and which passes through a center point of the planar surface of the first target 51.

The sloping surface 54 has an inner periphery concentrically surrounding the circular periphery of the planar surface 53 and an outer periphery nearer to the holder 25 (FIG. 1) than the inner periphery. The inner and the outer peripheries are positioned around the center axis 55. In the example being illustrated, the sloping surface 54 is conical.

In FIG. 6, the circular and the inner peripheries are spaced apart from each other by a gap 56 left therebetween. The circular and the inner peripheries are coplanar. The first and the second targets 51 and 52 are electrically connected to each other by a conductive body 57 which is similar to the conductive body 34 illustrated in FIG. 1.

The magnet member 32 comprises a pair of permanent magnets 61 and 62 which is similar to a pair of the permanent magnets 37 and 38 illustrated in FIG. 1. The permanent magnets 61 and 62 are positioned around the center axis 55 in the manner described in conjunction with FIG. 1. A yoke 63 is for magnetically connecting the permanent magnets 61 and 62. The permanent magnet pair 61-62 produces a first part of a magnetic field. The first part of the magnetic field is represented by a few arcuate solid line curves 65 representative of magnetic lines. That is to say, the first part of the magnetic field is produced in a predetermined space between the target assembly 20 and the holder 25. More particularly, the first part of the magnetic field is adjacent to the planar surface 53 between the center point and the circular periphery. The first part of the magnetic field intersects the electric field (FIG. 1). The permanent magnet pair 61-62 may be referred to as a first magnet which is for producing the first part of the magnetic field adjacent to the planar surface 53.

The magnet member 32 further comprises an electromagnet 67 of a ring shape. The electromagnet 67 is positioned around the center axis 55 and surrounds the second target 52. The electromagnet 67 produces a second part of the magnetic field. The second part of the magnetic field is represented by a few arc-shaped magnetic lines as solid line curves 68 which are again representative of magnetic lines. That is to say, the second part of the magnetic field is also produced in the predetermined space. The second part of the magnetic field is adjacent to the sloping surface 54 between the outer and the inner peripheries. The second part of the magnetic field intersects the electric field (FIG. 1). The electromagnet 67 may be referred to as a second magnet which is for producing the second part of the magnetic field adjacent to the sloping surface 54. A yoke 69 of a ring shape surrounds the electromagnet 67.

With this structure, a first plasma of a high density is produced in a first ring-shaped space to which the planar surface 53 is exposed and in which the magnetic lines 65 are present. A second plasma is also of a high density and is produced in a second ring-shaped space to which the sloping surface 54 is exposed and in which the magnetic lines 68 is present. The first and the second ring-shaped spaces are positioned around the center axis 55.

The first target 51 is subjected to the bombardment of ions of the first plasma on a first ring-shaped area of the planar surface 53 which is exposed to the first ring-shaped space. As a result, a first group of sputtered particles of the predetermined material are emitted from the first ring-shaped area to the object 26 (FIG. 1) in the directions which are representatively indicated at arrows 71 in FIG. 6.

The second target 52 is likewise subjected to the bombardment of ions of the second plasma on the second ring-shaped area of the sloping surface 54 which is exposed to the second ring-shaped space. As a result, a second group of sputtered particles of the predetermined material are emitted from the second ring-shaped area to the object 26 (FIG. 1) in the directions which are representatively indicated at arrows 72 in FIG. 6.

Thus, a thin film of the predetermined material is formed onto the object 26 (FIG. 1).

Each of the first group of the sputtered particles emitted from the planar surface 53 in the directions 71 has a vertical velocity component perpendicular to the surface of the object 26 (FIG. 1) and a parallel velocity component which is parallel to the surface of the object 26 (FIG. 1) and which is directed from the center of the object 26 (FIG. 1) to the periphery of the object 26 (FIG. 1). Therefore, the first group of the sputtered particles dominantly contribute to an increase in the inner coverage ratio $t_{in}/T_0$. On the other hand, each of the second group of the sputtered particles emitted from the sloping surface 54 in the directions 72 dominantly has a velocity component which is parallel to the surface of the object 26 (FIG. 1) and which is directed from the periphery of the object 26 (FIG. 1) to the center of the object 26 (FIG. 1). Therefore, the second group of the sputtered particles dominantly contribute to an increase in the outer coverage ratio $t_{out}/T_0$. A degree of contribution by the second target 52 to the increase in the coverage ratios $t_{in}/T_0$ and $t_{out}/T_0$ is controllable by a ratio of an auxiliary emission amount of the second group of the sputtered particles to a principal emission amount of the first group of the sputtered particles. In addition, the degree is controllable by the emission amounts of the first and the second groups of the sputtered particles, respectively. Furthermore, the degree is controllable by an angle formed by the sloping surface 54 and the planar surface 53.

It is possible not only to macroscopically attain the uniformity of the film thickness distribution but also to microscopically attain a high outer coverage ratio around each projection of the object by suitably selecting geometrical arrangements of the planar and the sloping surfaces 53 and 54 and intensities of the first and the second parts of the magnetic field. Thus, the target assembly is capable of forming a uniform film on the nonuniform surface of the object 26 (FIG. 1).

Figure 7:
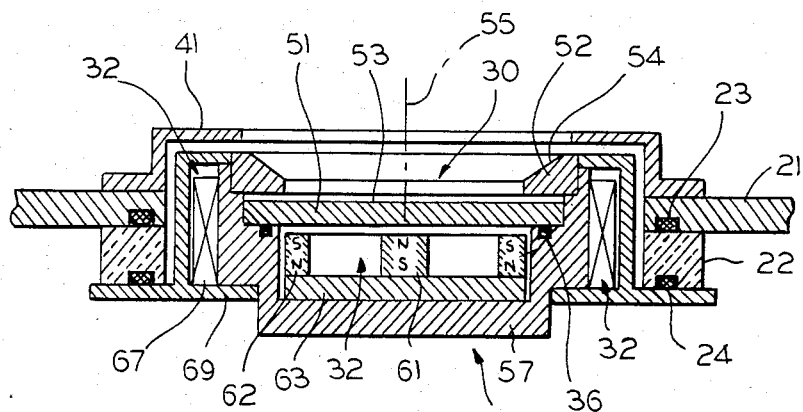
FIG. 7 is a schematic vertical sectional view of a target assembly according to a second embodiment of this invention.

Referring to FIG. 7, a target assembly according to a second embodiment of this invention comprises similar parts designated by like reference numerals.

The first target 51 has a diameter which is larger than a diameter of the inner periphery of the second target 52. The second target 52 is positioned nearer to the holder 25 than the first target 51 and around the center axis 55, like in FIG. 6.

Let the target assembly illustrated in FIG. 6 be seen from a position of the holder 25. In this event, the conductive body 57 is exposed through the gap 56 to the predetermined space. This implies that the conductive body 57 is subjected to the ion bombardment together with the first and the second targets 51 and 52 and that a material of the conductive body 57 is also sputtered by the ion bombardment. As a result, the material of the conductive body 57 is inevitably doped into the film as an impurity.

In FIG. 7, the conductive body 57 is hidden or covered up from the predetermined space by the first target 51 which is widened in comparison with that illustrated in FIG. 6 and underlies the second target 52. Consequently, the conductive body 57 is not subjected to the ion bombardment. Therefore, the material of the conductive body 57 is not sputtered onto the object and is not doped into the film as an impurity.

Figure 8:
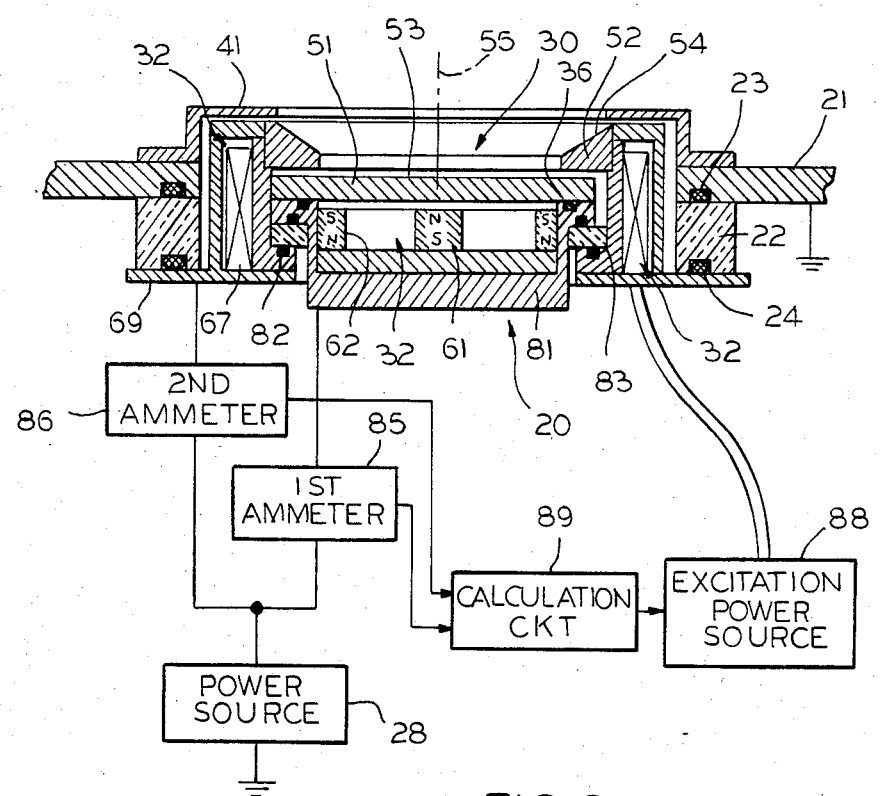
FIG. 8 is a schematic vertical sectional view of a target assembly according to a third embodiment of this invention.

Referring to FIG. 8, a target assembly according to a third embodiment of this invention comprises similar parts designated by like reference numerals.

The target member 30 further comprises first and second conductive bodies 81 and 82 which are electrically insulated from each other by an electrical insulator 83. The first conductive body 81 is electrically connected to the first target 51 while the second conductive body 82 is electrically connected to the second target 52. The yoke 69 is brought into contact with the second conductive body 82. The yoke 69 is of a ferromagnetic material, such as iron or permalloy, having a high electric conductivity. Thus, the first target 51 is also electrically insulated from the yoke 69 by the insulator 83 because the first and the second targets 51 and 52 are electrically insulated from each other, as mentioned before.

A first ammeter 85 is coupled to the d.c. power source 28 and the first conductive body 81. The first target 51 is supplied with a negative voltage from the d.c. power source 28 through the first ammeter 85 and the first conductive body 81. Operation of the first ammeter 85 will be presently described. A second ammeter 86 is coupled between the d.c. power source 28 and the yoke 69. The second target 52 is supplied with the negative voltage from the d.c. power source 28 through the second ammeter 86, the yoke 69, and the second conductive body 82. Operation of the second ammeter 86 will also be described soon.

An excitation power source 88 is coupled to the electromagnet 67. The excitation power source 88 is for supplying the electromagnet 67 with a controllable excitation current or signal with reference to an input signal thereof. Detailed description of the exciting power source 88 and the input signal will presently follow.

With this structure, the first and the second targets 51 and 52 are bombarded by ions. The ions are generated between the holder 25 (FIG. 1) and the first and the second targets 51 and 52 with cooperation of the first and the second parts of the magnetic and the electric fields like in FIG. 6. The ions cause a first and a second ion current to flow through the first and the second targets 51 and 52, respectively.

The first ammeter 85 is operable as a first detecting device for detecting the first ion current to produce a first detection signal representative of the first ion current. Likewise, the second ammeter 86 is operable as a second detecting device for detecting the second ion current to produce a second detection signal representative of the second ion current.

A calculation circuit 89 is coupled to the first and the second ammeters 85 and 86 to carry out a predetermined calculation (to be described later) in response to the first and the second detection signals and to produce a result signal representative of a result of calculation. The exciting power source 88 is coupled to the calculation circuit 89 and receives the result signal as the input signal. The exciting power source 88 may be referred to as a signal supply device which is for supplying the electromagnet 67 with the controllable excitation signal with reference to the result signal. The electromagnet 67 is controlled in response to the excitation signal to produce the second part of the magnetic field controlled by the excitation signal. Accordingly, the calculation circuit 89 and the exciting power source 88 may be called a magnetic field controlling device for controlling the second magnet 52 to make the second target 52 produce the second part as mentioned above. More particularly, the calculation circuit 89 calculates a ratio of the first ion current to the second ion current on carrying out the predetermined calculation. Alternatively, a sum of the first and the second ion currents may be calculated instead of the above-mentioned ratio. Anyway, control operation is made so that either the ratio or the sum becomes equal to a value predetermined for each of the ratio and the sum.

In addition, control operation may be carried out so that the first and the second ion currents become equal to a first and a second preselected value, respectively.

It is possible not only to macroscopically attain the uniformity of the film thickness distribution but also to microscopically attain a high outer coverage ratio around each projection of the object 26 (FIG. 1) by suitably selecting geometrical arrangements of the planar and the sloping surfaces 53 and 54 and intensities of the first and the second parts of the magnetic field in the above-mentioned manner. Thus, the target assembly is capable of forming a uniform film on the nonuniform surface of the object 26.

Figure 9:
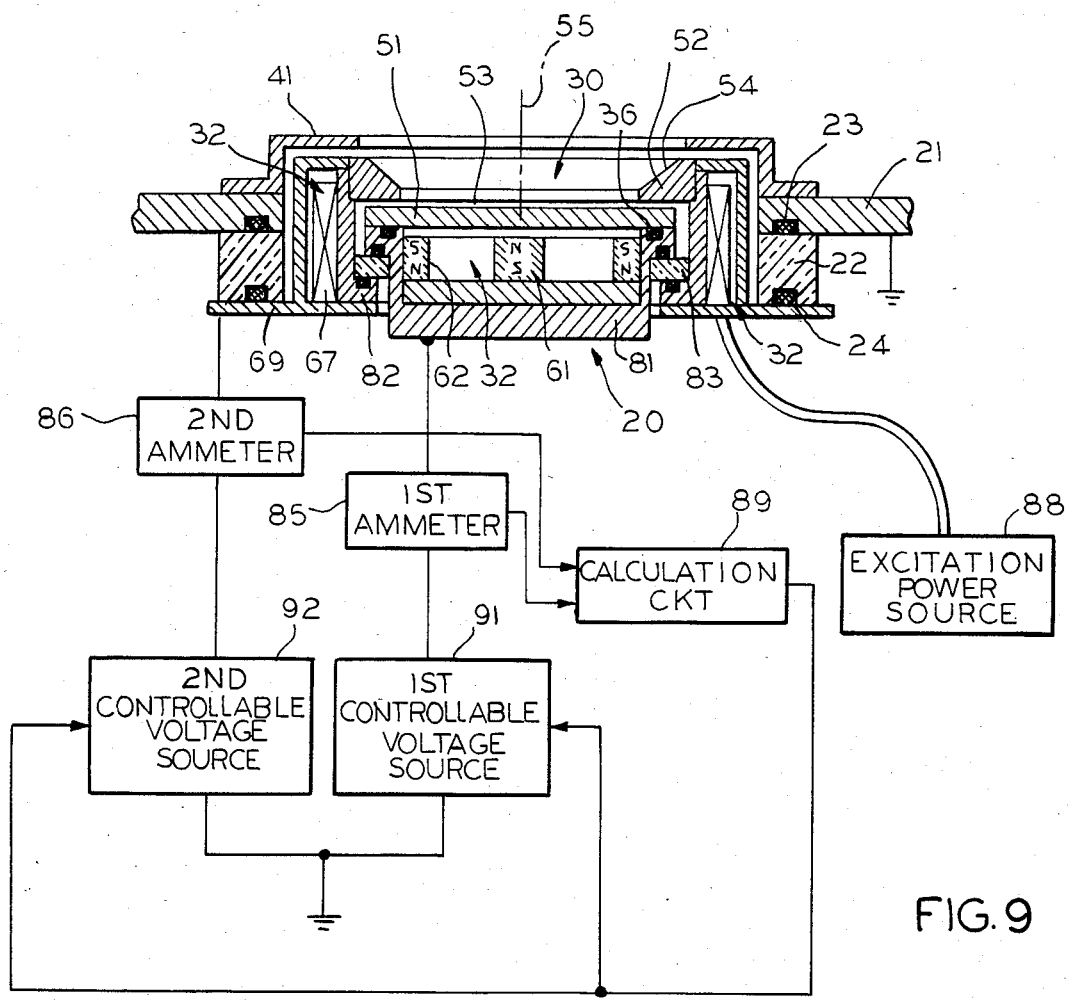
FIG. 9 is a schematic vertical sectional view of a target assembly according to a fourth embodiment of this invention.

Referring to FIG. 9, a target assembly according to a fourth embodiment of this invention is similar to that illustrated in FIG. 8 except that first and second controllable voltage sources 91 and 92 are individually connected to the first and the second ammeters 85 and 86, respectively, and are controlled by the result signal supplied from the calculation circuit 89. More specifically, the first controllable voltage source 91 is coupled to the calculation circuit 89 and to the first conductive body 81 through the first ammeter 85. Supplied with the result signal from the calculation circuit 89, the first controllable voltage source 91 produces a negative voltage in response to the result signal. As a result, a part of the electric field is controlled in accordance with the negative voltage to adjust the first ion current to the first preselected value and may be referred to as a first partial electric field.

Likewise, the second controllable voltage source 92 is supplied with the result signal from the calculation circuit 89 and delivers another negative voltage to the second target 52 through the second ammeter 86, the yoke 69, and the second conductive body 82. As a result, another part of the electric field is produced from the second target 52 as a second partial electric field. The second partial electric field serves to adjust the second ion current to the second preselected value. As mentioned above, the calculation circuit 89 is operable to control the first and the second controllable voltage sources 91 and 92 and to adjust the first and the second ion currents to the first and the second preselected values, respectively. Therefore, the calculation circuit 89 may be referred to as a controlling circuit.

With this structure also, the uniformity of the film thickness distribution is accompanied together with a high outer coverage ratio around each projection of the object 26, like in FIG. 8. Thus, the target assembly is capable of forming a uniform film even on the nonuniform surface of the object 26.

Figure 10:
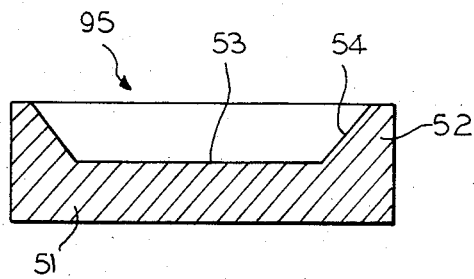
FIG. 10 is a schematic vertical sectional view of a target member for use in a target assembly according to a fifth embodiment of this invention.

Finally referring to FIG. 10, a target member 95 is for use in a target assembly according to a fifth embodiment of this invention and is applicable to each of the target members 30 illustrated in FIGS. 6 and 7. In FIG. 10, the target member 95 comprises the first target 51 and the second target 52 which is integral with the first target 51. The circular peripheray of the planar surface 53 of the first target 51 is therefore contiguous to the inner periphery of the sloping surface 54 of the second target 52. The target assembly can readily be assembled by the use of such an integral target member 95.

While the present invention has thus far been described in conjunction with several preferred embodiments thereof, it will now be readily possible for those skilled in the art to practice this invention in various other manners. For example, the first magnet may be an electromagnet and the second magnet may be a permanent magnet. Furthermore, each of the first and the second magnets may be a permanent magnet. In this case, the magnetic field controlling device may mechanically control positions of the first and the second magnets in response to the first and the second detection signals. This structure also enables the first and the second magnets to produce the first and the second parts of the magnetic fields such that the first and the second ion currents become equal to the first and the second preselected values, respectively. Moreover, the magnetic field controlling device may mechanically control magnetic reluctances of magnetic circuits defined by the first and the second magnets in the above-mentioned manner.

What is claimed is:

1. A target assembly for use in a sputtering device comprising holding means for holding at least one object in a face to face relationship with said target assembly, and electric field producing means for producing an electric field between said target assembly and said holding means, said at least one object being covered with a layer at a step coverage ratio defined in relation to steps left on said at least one object, said target assembly comprising:

a first target made of a predetermined material having a planar surface surrounded by a circular periphery and having a center axis perpendicular to said planar surface, a said planar surface being kept substantial parallel to said at least one object;

a second target made of said predetermined material having an inner periphery adjacent to and concentric with said circular periphery, an outer periphery placed outside said inner periphery relative to said planar surface, and a sloping surface extending between said inner and outer peripheries so that said outer periphery is nearer said holding means than said inner periphery;

a first magnet which is magnetically coupled to said first target for producing a first part of a magnetic field which locally intersects said electric field to sputter said planar surface; and a second magnet which is magnetically coupled to said second target for producing a second part of said magnetic field which locally intersects said electric field to sputter said sloping surface and to form said layer of the predetermined material on said at least one object with a cooperation of said first and said second parts of said magnetic and said electric fields so that said step coverage ratio becomes substantially uniform on each step of said at least one object.

2. A target assembly as claimed in claim 1, said first target passing through a center point of said planar surface, wherein:

said first magnet being for producing said first part of said magnetic field between said center point and said circular periphery; and said second magnet being for producing said second part of said magnetic field between said outer and said inner peripheries.

3. A target assembly as claimed in claim 1, wherein said circular and said inner peripheries are spaced apart from each other.

4. A target assembly as claimed in claim 3, wherein said circular and said inner peripheries are coplanar.

5. A target assembly as claimed in claim 3, wherein said first and said second targets are electrically connected to each other.

6. A target assembly as claimed in claim 3, wherein said first and said second targets are electrically insulated from each other.

7. A target assembly as claimed in claim 1, wherein said circular and said inner peripheries are contiguous to each other.

8. A sputtering device comprising a target assembly, holding means for holding at least one object in a face to face relationship with said target assembly and with a space left between said holding means and said target assembly, and electric field producing means for producing an electric field between said target assembly and said holding means, said at least one object being covered with a layer at a step coverage ratio which is defined in relation to steps left on said at least one object, said target assembly comprising:

a first target made of a predetermined material having a planar surface surrounded by a circular periphery and having a center axis perpendicular to said planar surface, said planar surface being kept substantial parallel to said at least one object;

a second target of said predetermined material having an inner periphery adjacent to and concentric with said circular periphery, an outer periphery placed outside said inner periphery relative to said planar surface, and a sloping surface extending between said inner and outer peripheries so that said outer periphery is nearer said holding means than said inner periphery;

a first magnet which is magnetically coupled to said first target for producing a first part of a magnetic field which locally intersects said electric field to sputter said planar surface; and a second target which is magnetically coupled to said second target for producing a second part of said magnetic field which locally intersects said electric field to sputter said sloping surface and to form said layer of the predetermined material on said at least one object with a cooperation of said first and said second parts of said magnetic and said electric fields so that said step coverage ratio becomes substantially uniform on each step of said at least one object.

9. A sputtering device as claimed in claim 8, said first target passing through a center point of said planar surface, wherein:

said first magnet being for producing said first part of said magnetic field between said center point and said circular periphery; and said second magnet being for producing said second part of said magnetic field between said outer and said inner peripheries.

10. A sputtering device as claimed in claim 8, wherein said circular and said inner peripheries are spaced apart from each other.

11. A sputtering device as claimed in claim 10, wherein said circular and said inner peripheries are coplanar.

12. A sputtering device as claimed in claim 10, wherein said first and said second targets are electrically connected to each other.

13. A sputtering device as claimed in claim 10, wherein said first and said second targets are electrically insulated from each other.

14. A sputtering device as claimed in claim 13, said first and said second targets being bombarded by ions generated in said space between said at least one object and said first and said second targets with cooperation of said first and said second parts of said magnetic and said electric fields on sputtering the predetermined material of said target member onto said object, said ions causing a first and a second ion current to flow through said first and said second targets, respectively, said sputtering device comprising:

first detecting means coupled to said first target for detecting said first ion current to produce a first detection signal representative of said first ion current;

second detecting means coupled to said second target for detecting said second ion current to produce a second detection signal representative of said second ion current; and controlling means coupled to at least one of said electric field producing means and said first and said second magnets and responsive to said first and said second detection signals for controlling said at least one of the electric field producing means and the first and the second magnets to adjust said first and said second ion currents to first and second preselected values, respectively.

15. A sputtering device as claimed in claim 14, wherein said electric field producing means comprises:

a first controllable voltage source coupled to said controlling means and coupled between said first target and said holding means for producing a first partial electric field as a part of said electric field to adjust said first ion current to said first preselected value; and a second controllable voltage source coupled to said controlling means and coupled between said second target and said holding means for producing a second partial electric field as another part of said electric field to adjust said second ion current to said second preselected value.

16. A sputtering device as claimed in claim 14, wherein said controlling means comprises:

magnetic field controlling means responsive to said first and said second detection signals and coupled to said first and said second magnets for controlling said first and said second magnets to make the same produce the first and the second parts of said magnetic fields such that said first and said second ion currents become equal to said first and said second preselected values, respectively.

17. A sputtering device as claimed in claim 16, a preselected one of said first and said second magnets comprising an electromagnet supplied with a controllable excitation signal, wherein said magnetic field controlling means comprises:

calculation means coupled to said first and said second detecting means and responsive to said first and said second detection signals for carrying out a predetermined calculation to produce a result signal representative of a result of said predetermined calculation; and signal supply means coupled to said calculation means and said electromagnet for supplying said electromagnet with said controllable excitation signal with reference to said result signal.

18. A sputtering device as claimed in claim 8, wherein said circular and said inner peripheries are contiguous to each other.

* * * * *